US009263637B2

(12) United States Patent
Tan et al.

(10) Patent No.: US 9,263,637 B2
(45) Date of Patent: Feb. 16, 2016

(54) PLASMONIC LIGHT EMITTING DIODE

(75) Inventors: Michael R. T. Tan, Menlo Park, CA (US); David A. Fattal, Mountain View, CA (US); Marco Fiorentino, Mountain View, CA (US); Shih-Yuan Wang, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 969 days.

(21) Appl. No.: 13/145,995

(22) PCT Filed: Jan. 30, 2009

(86) PCT No.: PCT/US2009/032698
§ 371 (c)(1),
(2), (4) Date: Jul. 22, 2011

(87) PCT Pub. No.: WO2010/087851
PCT Pub. Date: Aug. 5, 2010

(65) Prior Publication Data
US 2011/0272669 A1    Nov. 10, 2011

(51) Int. Cl.
*H01L 33/00* (2010.01)
*H01L 33/20* (2010.01)
*H01L 33/02* (2010.01)
*H01L 33/04* (2010.01)
*H01L 33/38* (2010.01)

(52) U.S. Cl.
CPC ............. *H01L 33/20* (2013.01); *H01L 33/02* (2013.01); *H01L 33/04* (2013.01); *H01L 33/387* (2013.01)

(58) Field of Classification Search
CPC ........ H01L 33/44; H01L 33/38; H01L 33/385; H01L 33/46; H01L 33/007; H01L 33/145; H01L 33/04; H01L 2933/0016; H01L 2924/12041; H01L 33/105; H01L 27/153; H01L 33/10; H01L 33/0075; H01L 33/465
USPC ................. 257/79, 91, 94, 98, 103, E33.001, 257/E33.008, E33.063, E33.065, E33.069; 438/141; 372/46.01, 46.013
See application file for complete search history.

(56) References Cited

U.S. PATENT DOCUMENTS 4,862,471 A      8/1989   Pankove
6,185,238 B1 *   2/2001   Onomura et al. .......... 372/46.01

(Continued)

FOREIGN PATENT DOCUMENTS

CN    1604409 A    4/2005
CN    1661826      8/2005

(Continued)

OTHER PUBLICATIONS

Supplementary European Search Report, Jun. 25, 2014, European Patent Application No. 09839424.0, 6 pages.

*Primary Examiner* — Meiya Li
(74) *Attorney, Agent, or Firm* — Patent Law Office of David Millers

(57) ABSTRACT

A light emitting diode (100 or 150) includes a diode structure containing a quantum well (120), an enhancement layer (142), and a barrier layer (144 or 148) between the enhancement layer (142) and the quantum well (120). The enhancement layer (142) supports plasmon oscillations at a frequency that couples to photons produced by combination of electrons and holes in the quantum well (120). The barrier layer serves to block diffusion between the enhancement layer (142) and the diode structure.

7 Claims, 2 Drawing Sheets

(56) References Cited

U.S. PATENT DOCUMENTS

| | | |
|---|---|---|
| 2003/0047744 A1* | 3/2003 | Yanamoto ............ 257/98 |
| 2005/0067625 A1 | 3/2005 | Hata |
| 2005/0087884 A1 | 4/2005 | Stokes et al. |
| 2005/0269578 A1 | 12/2005 | Barnes et al. |
| 2005/0285128 A1 | 12/2005 | Scherer et al. |
| 2007/0181889 A1 | 8/2007 | Orita |
| 2008/0142782 A1 | 6/2008 | Moon et al. |
| 2008/0179610 A1* | 7/2008 | Okamoto et al. ............ 257/98 |

FOREIGN PATENT DOCUMENTS

| | | |
|---|---|---|
| CN | 1809796 A | 7/2006 |
| CN | 1921157 A | 2/2007 |
| JP | 2005108982 A | 4/2005 |
| JP | 2006093675 A | 4/2006 |
| JP | 2008283096 A | 11/2008 |
| KR | 20080055538 A | 6/2008 |

* cited by examiner

PLASMONIC LIGHT EMITTING DIODE

BACKGROUND

Light emitting diodes (LEDs) can convert electrical energy into optical energy for lighting and optical signaling. In general, LEDs are semiconductor diodes, typically containing a p-i-n junction. When an LED is forward biased, a current of electrons from the n-type material of the diode and holes from the p-type material of the diode combine. LEDs generally employ materials that create a suitable energy difference between the conduction band of electrons and the valence band of holes, so that the combination of an electron and a hole can spontaneously emit a photon. The energy difference is generally limited by the available materials but can otherwise be tuned or chosen to produce a desired frequency of light. Additionally, an LED can employ multiple layers of materials with conduction bands of different energies to create a quantum well that tends to confine electrons or holes and enhance the rate of spontaneous emissions, thereby improving energy efficiency of light production.

The spontaneous emission rate of a quantum well in an LED is not an intrinsic property of the quantum well, but instead depends on the electromagnetic environment of the quantum well. A plasmonic LED can exploit this phenomenon by positioning a quantum well close to a metal that supports the formation of surface plasmon polariton with electron-plasma oscillations extending into the quantum well. These electron-plasma oscillations or plasmons increase the electron-hole pair recombination rate within the quantum well via the Purcell effect and decrease the delay between a change in the current driving the LED and the corresponding change in the light emitted from the LED. Plasmonic LEDs can emit light with a modulation speed of about 10 GHz or faster while maintaining a radiative efficiency above about 20%, which compares well with the modulation speeds and efficiencies of VCSELs and other semiconductor lasers. International App. No. US/2008/001319, entitled "PLASMON ENHANCED LIGHT-EMITTING DIODES" describes some prior plasmonic LEDs that are fast enough for use in high data rate signaling.

One concern in manufacture of plasmonic LEDs is the materials available that are able to support surface plasmons of the proper frequencies for a plasmonic LED. Considering the limitations on the frequency of the emitted light placed by the available materials suitable for LEDs, silver and gold have been found to have surface plasmons with a desirable coupling for improving the response of an LED. Unfortunately, silver and gold, which must be close to a quantum well to provide the desired enhancement, have a tendency to migrate or diffuse in the semiconductor materials used in LEDs, and this diffusion can cause rapid degradation and shorting of the LED.

BRIEF DESCRIPTION OF THE DRAWINGS

Use of the same reference symbols in different figures indicates similar or identical items.

DETAILED DESCRIPTION

In accordance with an aspect of the invention, a plasmonic LED can include a barrier between the semiconductor structures and a metal layer (e.g., a silver or gold layer) that supports plasmon oscillations at a frequency that enhances LED performance. In one embodiment, the barrier can be thin (e.g., about 10 nm or less) and include an insulating material such as an oxide and a contact structure of a conductive material such as a non-diffusive metal (e.g., platinum). The barrier being relatively thin and mostly made of a dielectric material allows the surface plasmon oscillations of the metal layer to interact with the quantum well in the LED, but the barrier can still block diffusion or spiking of metals such as silver or gold from the enhancement layer into the semiconductor layers. The patterned contact is an ohmic contact for injection of current into the LED and can be made of a non-diffusive metal such as platinum. Further, the contact can be patterned to improve light extraction, and the contact area can be minimized to ensure light-plasmon interaction between the quantum well and the enhancement layer while still guaranteeing good current injection. In an alternative embodiment, the barrier can be even thinner (e.g., about 2 nm) and made of non-diffusive conductive material such as platinum that blocks diffusion or spiking a metal such as silver or gold from the metal layer. While the barrier metal may have poor plasmon characteristics for enhancement of spontaneous emissions in the quantum well, the barrier being sufficiently thin still allows interactions of the desired surface plasmons in the metal layer with the quantum well.

Figure 1A:
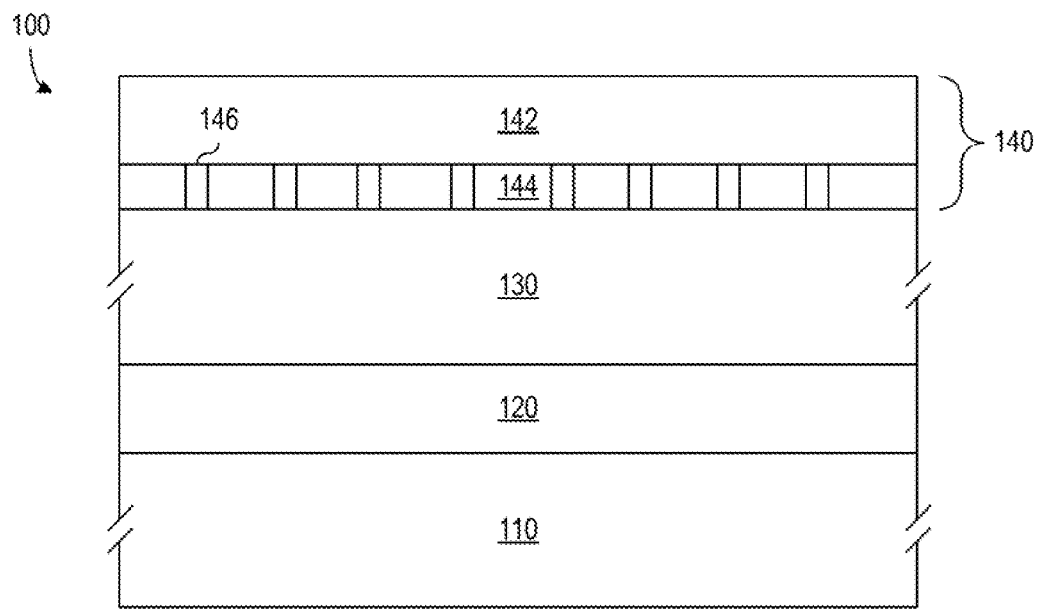
FIGS. 1A and 1B schematically illustrate cross-sectional views of plasmonic LEDs in accordance with embodiments of the invention using alternative barrier structures to prevent unwanted diffusion but permit plasmon interactions with quantum wells.

FIG. 1A shows a schematic representation of a cross-section of a plasmonic LED 100 in accordance with an embodiment of the invention. LED 100 has a p-i-n structure, which broadly includes a p-type structure 110, an intrinsic structure 120, and an n-type structure 130. Intrinsic structure 120 is generally a multi-layer structure that includes a quantum well, which is a source of the light (i.e., photons) produced by spontaneous emissions when electrons injected from n-type structure 130 combine with holes injected from p-type structure 110. An enhancement structure 140 contains a layer 142 of material that supports surface plasmon oscillations having a frequency that enhances the rate of spontaneous emissions from the quantum well. Layer 142 may be a blanket layer or may be patterned or roughened if desired to alter properties of the plasmons in layer 142. In general, greater enhancements can be achieved by placing enhancement structure 140 (particularly layer 142 since contacts 146 may have poor plasmonic properties) nearer to the quantum well so that the effects of plasmon oscillations extend into the quantum well. Enhancement layer 142 typically needs to be less than about 50 nm from the quantum well for significant enhancement of spontaneous emissions at photon wavelengths around 800 nm. The separation may be greater in LEDs producing longer wavelength light. In FIG. 1A, enhancement structure 140 is adjacent to n-type structure but may be better placed adjacent to p-type structure 110 in embodiments where p-type structure 110 is thinner than n-type structure 130.

Layer 142 in enhancement structure 140 may be made of a metal such as pure or alloyed silver or gold but other metals might be suitable. Diffusion or spiking of metal atoms from layer 142 into the semiconductor structure is an issue, particularly because layer 142 needs to be close to the quantum well to enhance spontaneous emissions. For example, it has been observed that GaAs dissolves readily into gold and gold based alloys. This dissolution results in equal amounts of gallium (Ga) and arsenic (As) entering into the gold lattice. Arsenic has been shown to be able to pass easily through the gold lattice and evaporate from the free surface of the gold. It is likely that atoms of such materials enter the metallization along grain boundaries or other such imperfections, although it is possible that the diffusion may enter as a very low concentration of highly mobile interstitial atoms. This phenomenon is also observed for the InGaP contact layer used in other LEDs.

To prevent diffusion from layer 142 into adjacent semiconductor layers, LED 100 includes an insulating barrier layer 144 containing a patterned conductive contact 146 that electrically connects layer 142 and n-type structure 130. Barrier layer 144 and patterned contact 146 can be less than about 10 nm thick and are preferably about 5 nm. In general, barrier layer 144 and contact 146 can be as thin as possible provided that barrier layer 144 and contact 146 sufficiently block diffusion from layer 142.

LED 100 can be operated by applying an appropriate voltage in a forward bias direction across LED 100. For example, for the p-i-n architecture of FIG. 1A, an electrical signal having positive polarity can be applied to layer 142 of LED 100 while layer 110 is connected to a reference voltage or ground. Electrical signals would generally be applied to LED 100 through a contact structure (not shown in FIG. 1A). The relatively negative voltage on n-type structure 110 can be thought of as driving electrons toward the quantum well in intrinsic structure 120, and the relatively positive voltage on layer 142 can be thought of as driving holes toward the quantum well. The quantum well may be made of a direct bandgap semiconductor material having an electronic bandgap energy that is smaller than the electronic bandgaps of the remaining layers of the LED 100. When the applied voltage difference is large enough to inject electrons from n-type structure 130 and holes from p-type structure 110 into the quantum well, spontaneous emissions resulting from combination of electrons and holes in the quantum well generate light that can be output from the LED 100 through p-type structure 110, that is opposite from enhancement structure 140.

The enhancement that structure 140 achieves can be understood by treating the combining of electrons and holes as decays of electron-hole dipoles. In general, the spontaneous emission rate of a decaying dipole depends not only on the strength of the dipole, but also on the electromagnetic environment of the dipole. By changing the electromagnetic environment near a dipole, the spontaneous decay rate of the dipole can be tuned (i.e., suppressed or enhanced), which is called the "Purcell effect." In the present case, introducing enhancement structure 140, which supports plasmon oscillations that couple to desired frequencies of light, enhances the rate at which the electron-hole dipoles decay into the desired electromagnetic mode or frequency. The Purcell factor $F_P$ quantifies the enhancement and is given by:

$$F_P = \frac{\text{Spontaneous Emission rate in complex environment}}{\text{Spontaneous Emission rate in bulk material}}$$

where the complex environment refers to the quantum well with adjacent enhancement structure 140, and the bulk material refers to the surrounding material, such as n-type and p-type structures 130 and 110, without enhancement structure 140. The larger the Purcell factor, the faster the spontaneous emission rate.

Figure 1B:
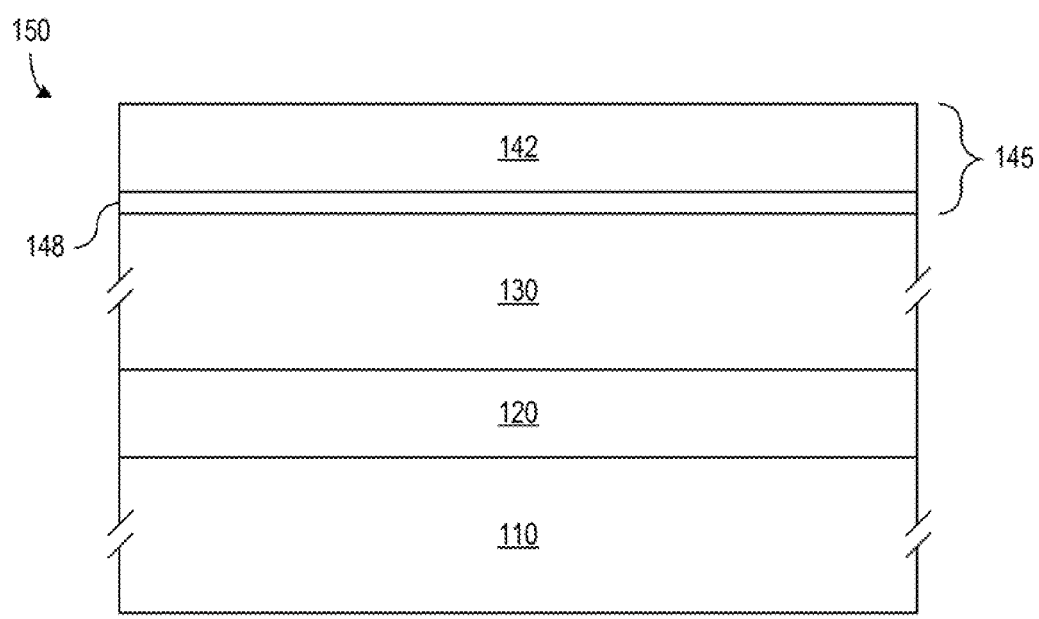

FIG. 1B illustrates an LED 150 using an enhancement structure 145 with a barrier layer 148 in accordance with an alternative embodiment of the invention. LED 150 includes a p-type structure 110, an intrinsic structure 120, an n-type structure 130, and a metal layer 142, which can be identical to the corresponding structures in LED 100 of FIG. 1A. LED 150 differs from LED 100 in that barrier 148 is a very thin (less than 5 nm) layer of a non-diffusive metal such as platinum between the thicker metal (e.g., Ag or Au) layer 142 and the underlying semiconductor structure. Barrier layer 148 may have poor plasmon properties for enhancement of spontaneous emission, but layer 148 is thin enough that the surface plasmon enhancement of the combination of layers 148 and 142 can still be as efficient as that of a single thick layer 142. In particular, a combination Pt/Au layer when the Pt portion is thin enough (e.g., less than 5 nm) can still be as efficient as a single Au layer at enhancing spontaneous emissions. Further, if barrier layer 148 is a platinum layer as thin as 2 to 3 nm, barrier layer 148 can still prevent unwanted diffusion between layer metal layer 142 and underlying semiconductor structures. Barrier layer 148 being conductive also has the advantage of providing a low resistance connection between layer 142 and the underlying semiconductor structure.

Figure 2:
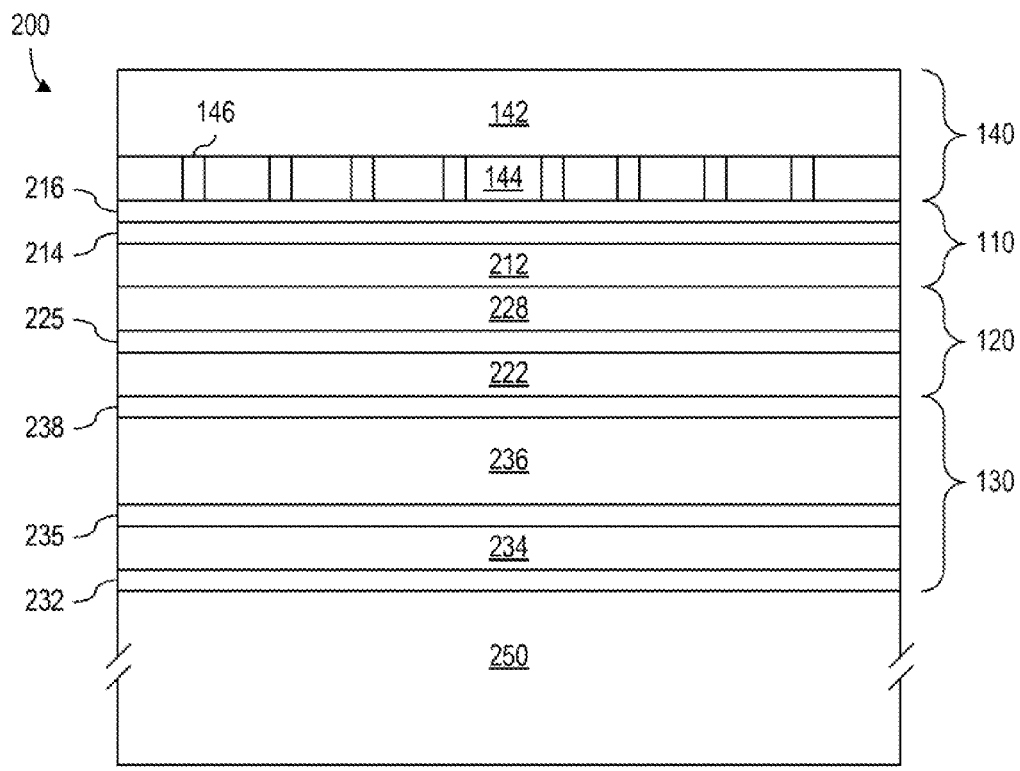
FIG. 2 shows a more detailed cross-sectional view of a plasmonic LED in accordance with another embodiment of the invention.

FIG. 2 shows an LED 200 in accordance with a specific embodiment of the invention that produces light having a wavelength of about 800 nm. LED 200 includes a gallium arsenide (GaAs) substrate 250, a multi-layer n-type structure 130 on substrate 250, a multi-layer intrinsic structure 120 on n-type structure 130, a multi-layer p-type structure 110 on intrinsic structure 120, and an enhancement structure 140 on p-type structure 110. The description of LED 200 below provides details of one specific embodiment of the invention. However, as will be understood by those in the art, the details regarding specific structural parameters such as materials, dopants, doping concentrations, the number of layers, the order of layers, and layer thicknesses are subject to variations in different embodiments of LEDs.

The n-type structure 130, which can be deposited or grown on substrate 250, includes five layers 232, 234, 235, 236, and 238 in the illustrated embodiment of FIG. 2. The bottom layer 232 is an n-type layer of indium-gallium-phosphorus (InGaP) about 20 nm thick and is doped with silicon (Si) to a concentration of about $2 \times 10^{18}$ cm$^{-3}$. The next three layers 234, 235, and 236 are mixtures of aluminum (Al), gallium (Ga), and arsenic (As). Layer 234, which is on layer 232, is $Al_{0.35}Ga_{0.65}As$ about 300 nm thick and doped with silicon to a concentration of about $2 \times 10^{18}$ cm$^{-3}$. Layer 236, which is on layer 235, is $Al_{0.65}Ga_{0.35}As$ about 500 nm thick and doped with silicon to a concentration of about $5 \times 10^{17}$ cm$^{-3}$. Layer 235, which is between layers 234 and 236, is a graded layer that is an $Al_xGa_{1-x}As$ mixture in which x ranges from 0.35 to 0.65 so that the composition of layer 235 transitions smoothly from the composition of layer 234 to the composition of layer 236. Graded layer 235 is about 15 nm thick and doped with silicon to a concentration of about $2 \times 10^{18}$ cm$^{-3}$. The top n-type layer 238 is another graded layer of $Al_xGa_{1-x}As$ about 15 nm thick, where x ranges from 0.65 to 0.35 so that layer 238 transitions smoothly from the composition of layer 236 to the composition of an overlying layer 222. The compositionally graded semiconductor layers 235 and 238 have the electronic bandgaps that vary with position and can be produced by changing the composition or ratios of the constituents used during a deposition process. The graded layers are used to improve the current flow by minimizing junction discontinuities and thereby reducing the series resistance between the semiconductor layers.

Intrinsic structure 120 includes three layers 222, 225, and 228 to create a quantum well with a bandgap structure that produces photons with the desired wavelength of about 800 nm. In the illustrated embodiment, bottom layer 222 is an undoped or intrinsic mixture of $Al_{0.35}Ga_{0.65}As$ and about 80 nm thick. Layer 225 is a mixture $GaAs_{0.885}P_{0.115}$ that is about 10 nm thick, and layer 228 is another layer of undoped $Al_{0.35}Ga_{0.65}As$ but is about 10 nm thick. The bandgaps of layer 222, 225, and 228 are such that layer 225 corresponds to a quantum well. Further, quantum well layer 225 has tensile strain of about +0.42% which results because of the thickness of layer 225 and the difference in the lattice constant of quantum well layer 225 and layers 222 and 228.

The p-type structure 110 includes three layers 212, 214, and 216 in the embodiment of FIG. 2. Layer 212 is the same mixture $Al_{0.35}Ga_{0.65}As$ as intrinsic layer 228 but is about 40 nm thick and is p-type with a doping of carbon at a concentration of about $1\times10^{18}$ cm$^{-3}$. Layer 214 is $Al_{0.2}Ga_{0.8}As$ that is about 7 nm thick and doped with a dopant such as carbon to a concentration of about $1\times10^{18}$ cm$^{-3}$. Layer 216 is p-type InGaP that is about 3 nm thick and doped with zinc to a concentration of about $1\times10^{18}$ cm$^{-3}$. In general, to maximize the Purcell factor, p-type structure 110 is as thin as possible to minimize the separation between overlying enhancement structure 140 and the quantum well in intrinsic structure 120.

Enhancement structure 140 can have substantially the same structure as described above in regard to FIG. 1A. In particular, enhancement structure 140 includes a barrier layer 144 made of an insulating material such as silicon dioxide or more preferably a high refractive index insulator such as titanium dioxide, which more closely matches the refractive indices of adjacent semiconductor structures. Barrier layer 144 is preferably less than about 10 nm thick. Contact 146 is made of a conductive material such as a non-diffusive metal and has a pattern with openings that permit interaction of optical modes of the quantum well with surface plasmons at the interface between layer 142 and barrier 144. Contact 146 can be made of a material having poor plasmon properties for enhancement of spontaneous emissions from the quantum well and accordingly may block the desired plasmon interactions in the areas of contacts 146. Ideally, the area occupied by contact 146 is kept to a minimum since contact 146 contributes little to the surface plasmon enhancement. Making contacts smaller may therefore improve enhancement of spontaneous emissions but may also increase the resistance to currents driven through LED 200. The area of contact 146 can be chosen to balance concerns for enhancement of spontaneous emissions and diode resistance. Alternatively, enhancement structure 140 can be replaced with the enhancement structure 145 of FIG. 1B, which provides a low resistance contact between metal layer 142 and underlying semiconductor structures.

Figure 3:
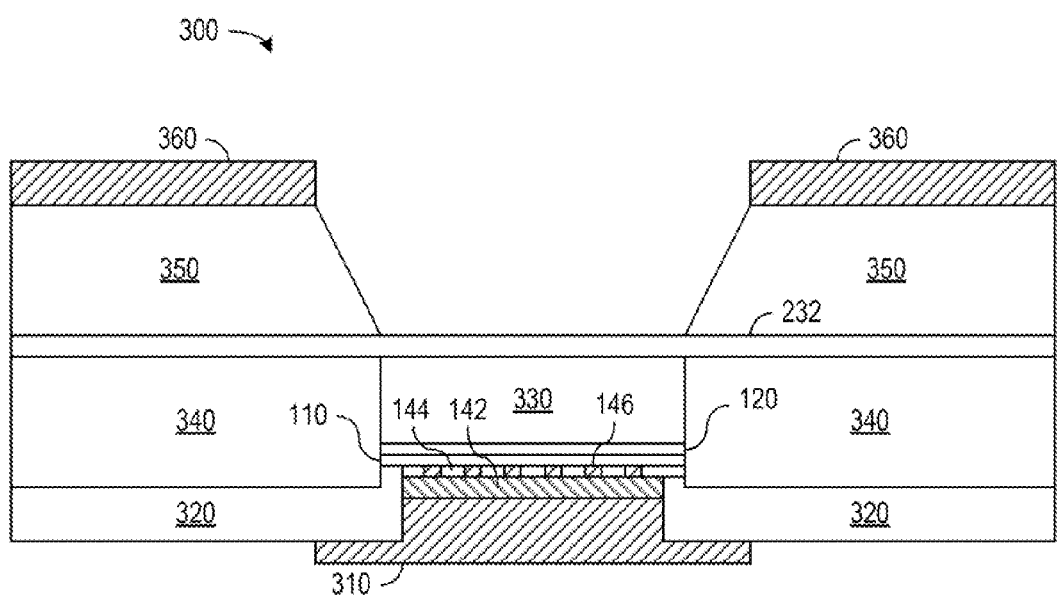
FIG. 3 shows a cross-sectional view of a plasmonic LED in accordance with another embodiment of the invention.

FIG. 3 illustrates a plasmonic LED 300 that includes external electrodes 310 and 360. LED 300 includes a p-type structure 110 and an intrinsic structure 120, which can be of the type described above. An n-type structure 330 of LED 300 can include layers 234, 235, 236, and 238 of FIG. 2. Layer 232 acts as an etch stop layer for a process that etches through substrate 250 (FIG. 2) to leave a region 350 (FIG. 3) surrounding the light emitting area of LED 300. Electrode 360 is on the remaining region 350 of the substrate and can be made of any suitable composition and may, for example, include a titanium adhesion layer and a gold contact layer. A transparent conductor such as indium tin oxide could alternatively or additionally be employed over the light emitting area of LED 300.

An enhancement structure of LED 300 includes a layer 142 of material such as AgZn, or Pt/AgZn with a very thin (<5 nm) Pt diffusion barrier, which can support surface plasmons with a strong coupling to photons produced by spontaneous emissions in the quantum well. This layer 142 can be deposited by standard techniques such as e-beam deposition or sputtering.

Layer 142 is electrically connected to contact 310. Barrier layer 144 and contact 146 are between layer 142 and p-type structure 110 in the embodiment of FIG. 3. The active area of LED 300 can be defined by an oxygen implant into an outer portion of the semiconductor structure to create insulating oxide regions 340 that surround the active region through which drive current is channeled. Alternatively, a mesa structure can be formed by etching past the quantum well into the bottom n-type AlGaAs layer. The active region of LED 300 for high data rate signaling would typically have a width or diameter of about 10 to 50 µm because larger areas tend to increase capacitance and cause signal delays. An insulating layer 320 of a material such as polyimide can also be deposited to better confine the drive current through electrode 310 to the active area of LED 300.

LED 300 can be operated by applying a positive polarity electrical signal, which may have a high frequency modulation for data transmissions, to electrode 310. Electrical current then flows from electrode 310, through layer 142 and contacts 146 into p-type structure 110, and p-type structure 110 injects holes into (i.e., empties electron valence states in) intrinsic structure 120. The drive current also corresponds to electrons flowing from electrode 360, through region 350, layer 232, and n-type structure 330 into intrinsic structure 120, where conduction electrons fall into emptied valence states, causing spontaneous emission of photons. The availability of plasmon oscillations in layer 142 enhances spontaneous emissions into the desired electromagnetic mode.

Although the invention has been described with reference to particular embodiments, the description is only an example of the invention's application and should not be taken as a limitation. Various other adaptations and combinations of features of the embodiments disclosed are within the scope of the invention as defined by the following claims.

What is claimed is:

1. A light emitting diode comprising:
   a diode structure containing a quantum well;
   an enhancement layer that supports plasmon oscillations at a first frequency, wherein the plasmon oscillations having the first frequency couple to photons produced by combination of electrons and holes in the quantum well; and
   a barrier layer and a patterned contact between the enhancement layer and the quantum well, wherein the barrier layer and the patterned contact block diffusion between the enhancement layer and the diode structure and wherein at least the barrier layer allows the plasmon oscillations of the enhancement layer to interact with the quantum well.

2. The light emitting diode of claim 1, wherein the enhancement layer comprises a material selected from the group consisting of silver and gold.

3. The light emitting diode of claim 1, wherein the barrier layer comprises an insulating layer.

4. The light emitting diode of claim 3, wherein the insulating layer comprises titanium dioxide.

5. The light emitting diode of claim 3, wherein the patterned contact is through the barrier layer, the patterned contact being electrically conductive.

6. The light emitting diode of claim 5, wherein the patterned contact comprises a metal.

7. The light emitting diode of claim 3, wherein the insulating layer is less than 10 nm thick.

* * * * *